US008552735B2

(12) United States Patent  
Hata et al.

(10) Patent No.: US 8,552,735 B2
(45) Date of Patent: Oct. 8, 2013

(54) SWITCHING APPARATUS AND TEST APPARATUS

(75) Inventors: Yoshiyuki Hata, Miyagi (JP); Makoto Nakanishi, Miyagi (JP); Masahiko Takikawa, Kanagawa (JP)

(73) Assignee: Advantest Corporation, Tokyo (JP)

( * ) Notice: Subject to any disclaimer, the term of this patent is extended or adjusted under 35 U.S.C. 154(b) by 342 days.

(21) Appl. No.: 13/034,622

(22) Filed: Feb. 24, 2011

(65) Prior Publication Data

US 2011/0316554 A1     Dec. 29, 2011

(30) Foreign Application Priority Data

Jun. 24, 2010 (JP) ................................ 2010-143848

(51) Int. Cl.
*G01R 31/02* (2006.01)
*G01R 27/08* (2006.01)

(52) U.S. Cl.
USPC ......................................... 324/537; 324/713

(58) Field of Classification Search
USPC ......... 324/537, 500, 415, 416, 417, 419, 178, 324/180, 522, 713, 76.11; 702/64; 361/131, 361/189, 190, 628, 631, 632, 643, 760, 781, 361/837
See application file for complete search history.

(56) References Cited

U.S. PATENT DOCUMENTS

| 6,292,342 | B1 * | 9/2001 | Miyamoto ..................... 361/86 |
| 6,946,846 | B2 * | 9/2005 | Corr .............................. 324/537 |
| 7,852,065 | B2 * | 12/2010 | Chen ............................. 324/537 |
| 7,973,543 | B2 * | 7/2011 | Andoh et al. .................. 324/713 |
| 2005/0094332 | A1 * | 5/2005 | Allmeier et al. ................ 361/23 |
| 2007/0103163 | A1 * | 5/2007 | Hachisuka et al. ........... 324/500 |
| 2010/0226149 | A1 * | 9/2010 | Masumoto ..................... 363/20 |
| 2012/0176163 | A1 * | 7/2012 | Wu .............................. 327/108 |

FOREIGN PATENT DOCUMENTS

| JP | H11-326458 A | 11/1999 |
| JP | H11-326459 A | 11/1999 |
| JP | 2000-183195 A | 6/2000 |
| JP | 2001-242224 A | 9/2001 |

* cited by examiner

*Primary Examiner* — Hoai-An D Nguyen

(57) ABSTRACT

To perform a forcible disconnection when voltage outside a reference range is applied to a terminal, provided is a switching apparatus comprising a main switch provided between a first terminal and a second terminal; a voltage detection section that detects whether voltage of the second terminal is within a reference range; and a control section that controls the main switch according to a control signal received from a control terminal and turns OFF the main switch when the voltage of the second terminal is outside the reference range. The voltage detection section includes a detection switch that disconnects the second terminal and the control section from each other when the voltage of the second terminal is within the reference range and connects the second terminal and the control section to each other when the voltage of the second terminal is outside the reference range.

12 Claims, 8 Drawing Sheets

SWITCHING APPARATUS AND TEST APPARATUS

BACKGROUND

1. Technical Field

The present invention relates to a switching apparatus and a test apparatus.

2. Related Art

A test apparatus supplies a device under test with a test signal and acquires a response signal output from the device under test in response to the test signal. The test apparatus compares the value of the response signal to an expected value to judge pass/fail of the device under test. Such a test apparatus includes a switching apparatus that turns ON/OFF a path between the device under test and a driver that outputs the test signal.

Patent Document 1: Japanese Patent Application Publication No. H11-326458
Patent Document 2: Japanese Patent Application Publication No. H11-326459

When an irregular voltage from the device under test occurs during testing, the test apparatus must forcibly turn OFF the switching apparatus to protect the circuits in the test apparatus. A conventional test apparatus may measure the voltage of a connection pin connected to the device under test using an AD converter, and use a processor to turn OFF the switching apparatus based on the measurement result. With this method, however, it is necessary to provide a plurality of AD converters corresponding to the pins of the test apparatus, thereby increasing the circuit size.

SUMMARY

Therefore, it is an object of an aspect of the innovations herein to provide a switching apparatus and a test apparatus, which are capable of overcoming the above drawbacks accompanying the related art. The above and other objects can be achieved by combinations described in the independent claims. According to a first aspect related to the innovations herein, provided is a switching apparatus comprising a main switch provided between a first terminal and a second terminal; a voltage detection section that detects whether voltage of the second terminal is within a reference range; and a control section that controls the main switch according to a control signal received from a control terminal and turns OFF the main switch when the voltage of the second terminal is outside the reference range. The voltage detection section includes a detection switch that disconnects the second terminal and the control section from each other when the voltage of the second terminal is within the reference range and connects the second terminal and the control section to each other when the voltage of the second terminal is outside the reference range. Also provided is a test apparatus including the switching apparatus.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
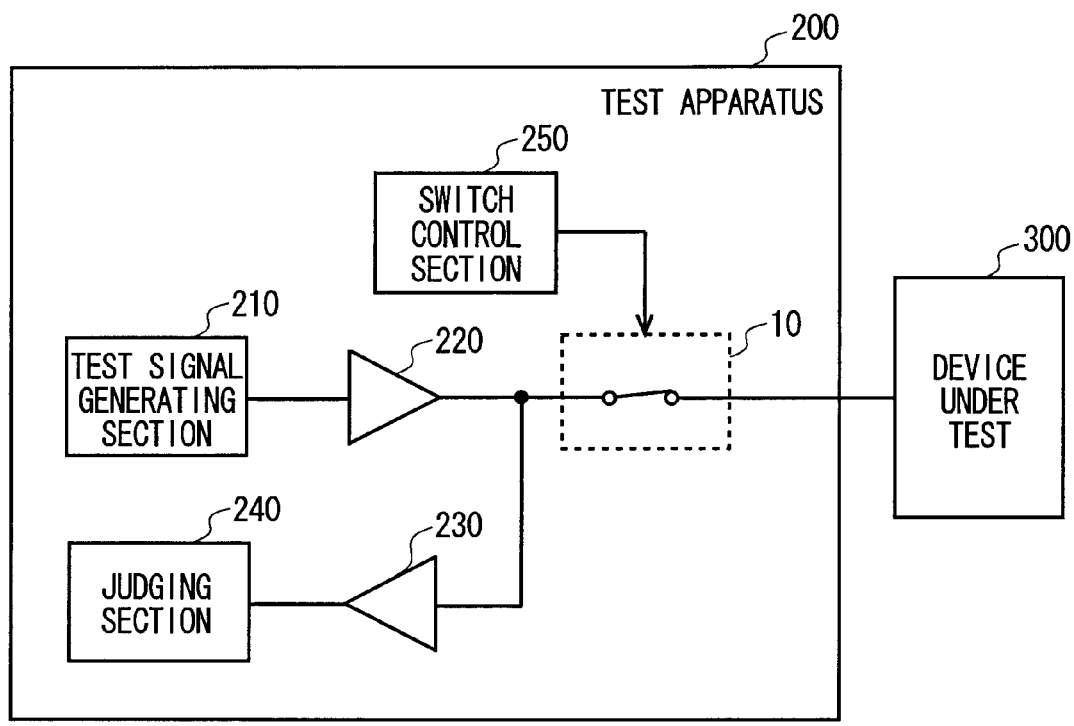
FIG. 1 shows a configuration of a test apparatus 200 according to an embodiment of the present invention, along with a device under test 300.

FIG. 1 shows a configuration of a test apparatus 200 according to an embodiment of the present invention, along with a device under test 300. The test apparatus 200 tests the device under test 300.

The test apparatus 200 includes a test signal generating section 210, a driver 220, a comparator 230, a judging section 240, a switching apparatus 10, and a switch control section 250. The test signal generating section 210 generates a test signal for testing the device under test 300.

The driver 220 supplies the device under test 300 with the test signal generated by the test signal generating section 210. The comparator 230 acquires the logic value of a response signal output from the device under test 300 in response to the test signal supplied thereto. The judging section 240 judges pass/fail of the device under test 300 by comparing the logic value acquired by the comparator 230 to an expected value.

The switching apparatus 10 is provided between the driver 220 and the device under test 300. The switching apparatus 10 forms a connection or a disconnection between the device under test 300 and the driver 220, according to the voltage of a control signal supplied from the switch control section 250. The switch control section 250 causes the switching apparatus 10 to be in a connection state during testing by the test signal generating section 210, and causes the switching apparatus 10 to be in a disconnection state when testing by the test signal generating section 210 is not being performed.

Figure 2:
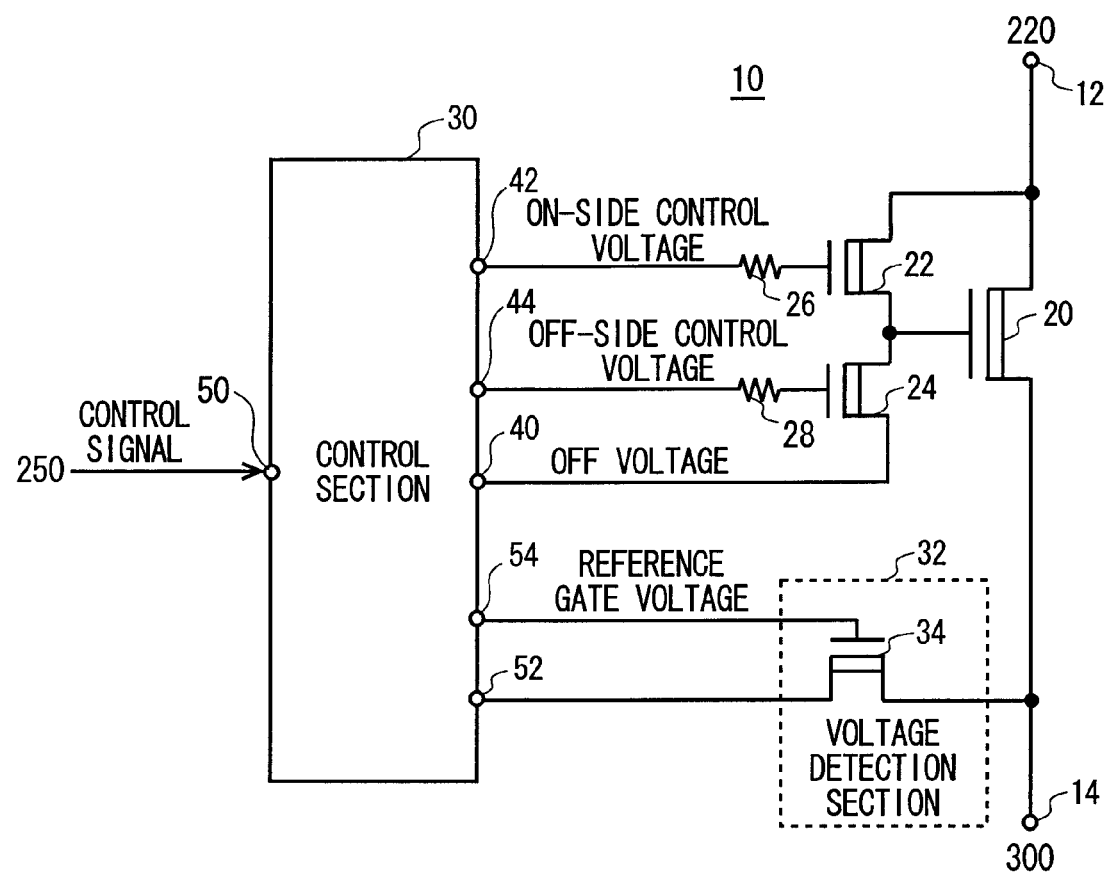
FIG. 2 shows a circuit configuration of the switching apparatus 10 according to the present embodiment.

FIG. 2 shows a circuit configuration of the switching apparatus 10 according to the present embodiment. The switching apparatus 10 provides a connection or a disconnection between a first terminal 12 and a second terminal 14, according to the voltage of a control signal received from the outside. In the present embodiment, the switching apparatus 10 connects the first terminal 12 to the driver 220 and connects the second terminal 14 to the device under test 300. The switching apparatus 10 can thereby provide a connection or a disconnection between the driver 220 and the device under test 300 according to the control signal supplied from the switch control section 250.

The switching apparatus 10 includes a main FET 20, an ON FET 22, an OFF FET 24, an ON-side input resistor 26, an OFF-side input resistor 28, a control section 30, and a voltage detection section 32.

The main FET 20 functions as a main switch provided between the first terminal 12 and the second terminal 14. The main FET 20 transmits a signal received from the first terminal 12 to the second terminal 14. The source of the main FET 20 is connected to the first terminal 12 and the drain of the main FET 20 is connected to the second terminal 14. In the present embodiment, the main FET 20 is an N-channel depletion type, and is a normally-ON FET that is ON when the gate-source junction voltage is 0 V.

The ON FET 22 functions as an ON switch electrically connected between the first terminal 12 and the gate of the main FET 20. The source of the ON FET 22 is connected to the source of the main FET 20, and the drain of the ON FET 22 is connected to the gate of the main FET 20.

The OFF FET 24 functions as an OFF switch connected between the gate of the main FET 20 and an OFF voltage for turning OFF the main FET 20. The source of the OFF FET 24 is connected to an OFF voltage terminal 40 of the control section 30, and the drain of the OFF FET 24 is connected to the gate of the main FET 20.

One end of the ON-side input resistor 26 is connected to an ON-side terminal 42 of the control section 30, and the other end of the ON-side input resistor 26 is connected to the gate of the ON FET 22. One end of the OFF-side input resistor 28 is connected to an OFF-side terminal 44 of the control section 30, and the other end of the OFF-side input resistor 28 is connected to the gate of the OFF FET 24.

The voltage detection section 32 detects whether the voltage of the second terminal 14 is within a reference range. In the present embodiment, the voltage detection section 32 detects whether the voltage of the second terminal 14 is less than a reference voltage.

The voltage detection section 32 includes a detection FET 34 provided between the second terminal 14 and a detection terminal 52 of the control section 30. The detection FET 34 functions as a detection switch that provides a disconnection between the second terminal 14 and the detection terminal 52 of the control section 30 when the voltage of the second terminal 14 is within the reference range and provides a connection between the second terminal 14 and the detection terminal 52 of the control section 30 when the voltage of the second terminal 14 is outside the reference range.

In the present embodiment, the detection FET 34 is an N-channel depletion FET. The source of the detection FET 34 is connected to the second terminal 14, the drain of the detection FET 34 is connected to the detection terminal 52 of the control section 30, and the gate of the detection FET 34 is connected to the gate voltage terminal 54 of the control section 30. The detection FET 34 is OFF when the voltage of the second terminal 14 is greater than or equal to a predetermined reference voltage, i.e. during normal operation. The detection FET 34 is ON when the voltage of the second terminal 14 is below the predetermined reference voltage, i.e. when an irregularity occurs.

The control section 30 turns the main FET 20 ON and OFF according to the voltage of a control signal input to the control terminal 50. When the main FET 20 is ON, the control section 30 turns ON the ON FET 22 and turns OFF the OFF FET 24. When the main FET 20 is OFF, the control section 30 turns OFF the ON FET 22 and turns ON the OFF FET 24.

In the present embodiment, the control section 30 outputs an ON-side control voltage from the ON-side terminal 42. The ON-side control voltage output from the ON-side terminal 42 is applied to the gate of the ON FET 22 via the ON-side input resistor 26. The control section 30 turns the ON FET 22 ON and OFF by changing the level of the ON-side control voltage according to the voltage of the control signal received from the control terminal 50.

The control section 30 outputs an OFF-side control voltage from the OFF-side terminal 44. The OFF-side control voltage output from the OFF-side terminal 44 is applied to the gate of the OFF FET 24 via the OFF-side input resistor 28. The control section 30 turns the OFF FET 24 ON and OFF by changing the level of the OFF-side control voltage according to the voltage of the control signal received from the control terminal 50.

When the ON FET 22 is ON and the OFF FET 24 is OFF, the gate-source voltage of the main FET 20 is 0 V. The main FET 20 is a normally-ON FET that is ON when the gate-source voltage is 0 V. Accordingly, the control section 30 can turn ON the main FET 20 by turning ON the ON FET 22 and turning OFF the OFF FET 24.

The control section 30 outputs from the OFF-voltage terminal 40 an OFF voltage that turns OFF the main FET 20. Specifically, the control section 30 outputs, as the OFF voltage from the OFF voltage terminal 40, a gate voltage that can completely turn OFF the main FET 20 when voltage in a predetermined range is applied to the first terminal 12. As a result, when the ON FET 22 is OFF and the OFF FET 24 is ON, a potential difference that completely turns OFF the main FET 20 is applied to the gate-source junction voltage of the main FET 20. Accordingly, the control section 30 can turn OFF the main FET 20 by turning OFF the ON FET 22 and turning ON the OFF FET 24.

The control section 30 outputs, from the gate voltage terminal 54, a reference gate voltage that turns OFF the detection FET 34 when the voltage of the second terminal 14 is greater than or equal to the reference voltage, i.e. during normal operation, and turns ON the detection FET 34 when the voltage of the second terminal 14 is less than the reference voltage, i.e. during irregular operation. As a result, the control section 30 disconnects the second terminal 14 from the detection terminal 52 of the control section 30 during normal operation and connects the second terminal 14 to the detection terminal 52 of the control section 30 during irregular operation.

When the voltage of the second terminal 14 is outside the reference range, e.g. when the voltage of the second terminal 14 is less than the reference voltage, the control section 30 forcibly turns OFF the main FET 20. In other words, when the detection FET 34 of the voltage detection section 32 is ON, i.e. when the second terminal 14 and the detection terminal 52 of the control section 30 are connected, the control section 30 forcibly turns OFF the ON FET 22 regardless of the voltage of the control signal, and also turns ON the OFF FET 24 and turns OFF the main FET 20.

The switching apparatus 10 described above turns ON the main FET 20 by using the ON FET 22 to form a connection between the gate and the source of the main FET 20, and can therefore cause the gate of the main FET 20 to be floating. As a result, the switching apparatus 10 can increase the insulation of the gate of the main FET 20 to improve the transmission characteristics of the signal transmitted between the source and the drain.

The switching apparatus 10 described above uses the detection FET 34 to detect an irregular voltage occurring in the second terminal 14, and does not use an AD converter or the like. Accordingly, the switching apparatus 10 can forcibly turn OFF the main FET 20 when an irregular voltage occurs in the second terminal 14, without using a processor. As a result, the switching apparatus 10 can have a smaller circuit size.

Figure 3:
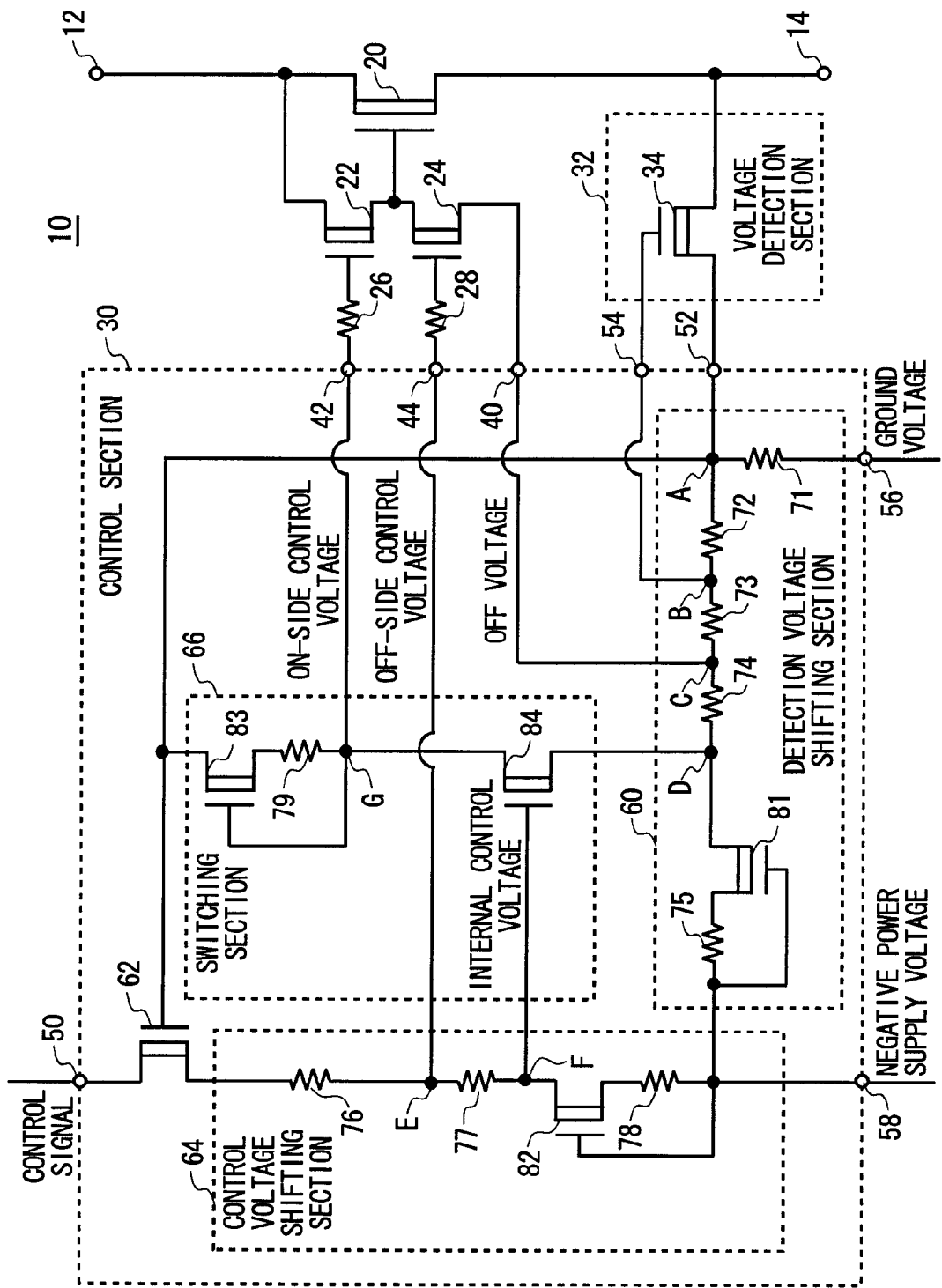
FIG. 3 shows an exemplary detailed circuit configuration of the switching apparatus 10 according to the present embodiment.

FIG. 3 shows an exemplary detailed circuit configuration of the switching apparatus 10 according to the present embodiment. The control section 30 may include a detection voltage shifting section 60, a control input FET 62, a control voltage shifting section 64, and a switching section 66. The control section 30 inputs a ground voltage to the ground terminal 56 and inputs a negative power supply voltage, which is lower than the ground voltage, to the power supply terminal 58.

The detection voltage shifting section 60 is provided between the ground terminal 56 and the power supply terminal 58. The detection voltage shifting section 60 includes a first resistor 71, a second resistor 72, a third resistor 73, a fourth resistor 74, a fifth resistor 75, and a first constant current FET 81.

One end of the first resistor 71 is connected to the ground terminal 56. One end of the second resistor 72 is connected to the end of the first resistor 71 that is not connected to the ground terminal 56. One end of the third resistor 73 is connected to the end of the second resistor 72 that is not connected to the first resistor 71. One end of the fourth resistor 74 is connected to end of the third resistor 73 that is not connected to the second resistor 72, and the other end of the fourth resistor 74 is connected to the drain of the first constant current FET 81. In other words, the first resistor 71, second resistor 72, third resistor 73, and fourth resistor 74 are connected in series between the ground terminal 56 and the drain of the first constant current FET 81.

One end of the fifth resistor 75 is connected to the source of the first constant current FET 81, and the other end of the fifth resistor 75 is connected to the power supply terminal 58. The gate of the first constant current FET 81 is connected to the power supply terminal 58.

The first constant current FET 81 and the fifth resistor 75 function as a constant current source that causes a constant current to flow through the first resistor 71, the second resistor 72, the third resistor 73, and the fourth resistor 74. As a result, the first resistor 71, the second resistor 72, the third resistor 73, and the fourth resistor 74 each generate a constant voltage corresponding to the product of the constant current and the resistance value thereof.

The detection voltage shifting section 60 described above generates, at a detection point A between the first resistor 71 and the second resistor 72, a voltage shifted from the ground potential toward the negative side by an amount equal to the voltage generated by the first resistor 71. The detection point A is connected to the detection terminal 52. In other words, the detection point A is provided at a terminal of the detection FET 34 on the opposite side of the second terminal 14. Accordingly, when the detection FET 34 is ON, the voltage of the second terminal 14 is further applied to the detection point A.

The detection voltage shifting section 60 generates, at a connection point B between the second resistor 72 and the third resistor 73, a voltage that is shifted from the voltage at the detection point A toward the negative side by an amount equal to the voltage generated by the second resistor 72. The connection point B is connected to the gate voltage terminal 54. Accordingly, the detection voltage shifting section 60 can supply the gate of the detection FET 34 with a reference gate voltage obtained by shifting the voltage at the detection point A toward the negative side by a predetermined voltage amount.

The detection voltage shifting section 60 generates, at a connection point C between the third resistor 73 and the fourth resistor 74, a voltage that is shifted from the voltage at the detection point A toward the negative side by an amount equal to the voltage generated by the second resistor 72 and the third resistor 73. The connection point C is connected to the OFF voltage terminal 40. Accordingly, the detection voltage shifting section 60 can supply the source of the OFF FET 24 with an OFF voltage obtained by shifting the voltage at the detection point A toward the negative side by a predetermined voltage amount.

The detection voltage shifting section 60 generates, at a connection point D between the fourth resistor 74 and the drain of the first constant current FET 81, a voltage that is shifted from the voltage of the detection point A toward the negative side by an amount equal to the voltage generated by the second resistor 72, the third resistor 73, and the fourth resistor 74. The connection point D is connected to the ON-side terminal 42 via the first switching FET 84 in the switching section 66. Accordingly, when the first switching FET 84 is ON, the detection voltage shifting section 60 can supply the gate of the ON FET 22 with an ON-side control voltage obtained by shifting the voltage at the detection point A toward the negative side by a predetermined voltage amount.

The drain-source junction of the control input FET 62 is connected between the control terminal 50 and the control voltage shifting section 64, and the gate of the control input FET 62 is electrically connected to the detection point A. More specifically, the drain of the control input FET 62 is connected to the control terminal 50 and the gate of the control input FET 62 is connected to the detection point A in the detection voltage shifting section 60.

The control voltage shifting section 64 is provided between the source of the control input FET 62 and the power supply terminal 58. The control voltage shifting section 64 includes a sixth resistor 76, a seventh resistor 77, an eighth resistor 78, and a second constant current FET 82.

One end of the sixth resistor 76 is connected to the source of the control input FET 62. One end of the seventh resistor 77 is connected to the end of the sixth resistor 76 that is not connected to the source of the control input FET 62.

One end of the eighth resistor 78 is connected to the source of the second constant current FET 82, and the other end of the eighth resistor 78 is connected to the power supply terminal 58. The gate of the second constant current FET 82 is connected to the power supply terminal 58.

The second constant current FET 82 and the eighth resistor 78 function as a constant current source that causes a constant current to flow to the sixth resistor 76 and the seventh resistor. As a result, the sixth resistor 76 and the seventh resistor 77 can each generate a constant voltage corresponding to the product of the constant current and the resistance value thereof.

When the control input FET 62 is completely ON, the control voltage shifting section 64 described above generates, at a connection point E between the sixth resistor 76 and the seventh resistor 77, a voltage shifted from the voltage of the control signal by an amount equal to the voltage generated by the sixth resistor 76. The connection point E is connected to the OFF-side terminal 44. Therefore, in this case, the control voltage shifting section 64 can supply the gate of the OFF FET 24 with an OFF-side control voltage obtained by shifting the voltage of the control signal by a predetermined voltage amount.

When the control input FET 62 is not completely ON, the control voltage shifting section 64 generates, at the source of the control input FET 62, a voltage shifted from the voltage at the detection point A by an amount equal to the voltage at the gate-source junction of the control input FET 62. Accordingly, in this case, the control voltage shifting section 64 generates, at the connection point E, a voltage shifted from the voltage at the detection point A by an amount equal to the voltage generated by the gate-source junction of the control input FET 62 and the sixth resistor 76. Therefore, in this case, the control voltage shifting section 64 can supply the gate of the OFF FET 24 with an OFF-side control voltage obtained by shifting the voltage of the detection point A by a predetermined voltage amount.

When the control input FET 62 is completely ON, the control voltage shifting section 64 generates, at a connection point F between the seventh resistor 77 and the drain of the second constant current FET 82, a voltage shifted from the voltage of the control signal by an amount equal to the sum of the voltage generated by the seventh resistor 77 and the voltage generated by the sixth resistor 76. The connection point F is connected to the gate of the first switching FET 84 in the switching section 66. As a result, in this case, the control voltage shifting section 64 can supply the switching section 66 with an internal control voltage obtained by shifting the voltage of the control signal by a predetermined voltage amount.

When the control input FET 62 is not completely ON, the control voltage shifting section 64 generates, at the connection point F, a voltage shifted from the voltage at the detection point A by an amount equal to the sum of the voltage of the gate-source junction of the control input FET 62, the voltage generated by the sixth resistor 76, and the voltage generated by the seventh resistor 77. As a result, in this case, the control voltage shifting section 64 can supply the switching section 66 with an internal control voltage obtained by shifting the voltage at the detection point A by a predetermined voltage amount.

When the control input FET 62 is completely ON, the control voltage shifting section 64 can output the internal control voltage and the OFF-side control voltage corresponding to the voltage of the control signal. Accordingly, the control voltage shifting section 64 can switch the levels of the internal control voltage and the OFF-side control voltage according to changes in the voltage level of the control signal. Furthermore, when the control input FET 62 is not completely ON, the control voltage shifting section 64 can output the OFF-side control voltage and the internal control voltage at predetermined levels.

The switching section 66 is provided between the connection point D and the detection point A of the detection voltage shifting section 60. The switching section 66 switches whether the gate of the ON FET 22 is supplied with the voltage at the detection point A of the detection voltage shifting section 60 as the ON-side control voltage or supplied with the voltage generated at the connection point D of the detection voltage shifting section 60 as the ON-side control voltage, according to the internal control voltage generated at the connection point F of the control voltage shifting section 64.

The switching section 66 includes a ninth resistor 79, a third constant current FET 83, and a first switching FET 84. One end of the ninth resistor 79 is connected to the drain of the first switching FET 84, and the other end of the ninth resistor 79 is connected to the source of the third constant current FET 83. The drain of the third constant current FET 83 is connected to the detection point A of the detection voltage shifting section 60 and the gate of the third constant current FET 83 is connected to the drain of the first switching FET 84. The gate of the first switching FET 84 is connected to the connection point F of the control voltage shifting section 64, and the source of the first switching FET 84 is connected to the connection point D of the detection voltage shifting section 60.

In the switching section 66, the connection point G between the ninth resistor 79 and the drain of the first switching FET 84 is connected to the ON-side terminal 42. Accordingly, the switching section 66 can supply the gate of the ON FET 22 with an ON-side control voltage that is the voltage generated at the connection point G.

The first switching FET 84 is turned ON and OFF according to the level of the internal control voltage generated at the connection point F of the control voltage shifting section 64. When the first switching FET 84 is OFF, the connection point G has the same potential as the detection point A of the detection voltage shifting section 60. When the first switching FET 84 is ON, the connection point G has the same potential as the connection point D of the detection voltage shifting section 60. As a result, the switching section 66 can switch the level of the ON-side control voltage supplied to the gate of the ON FET 22, according to the internal control voltage generated by the control voltage shifting section 64.

Figure 4:
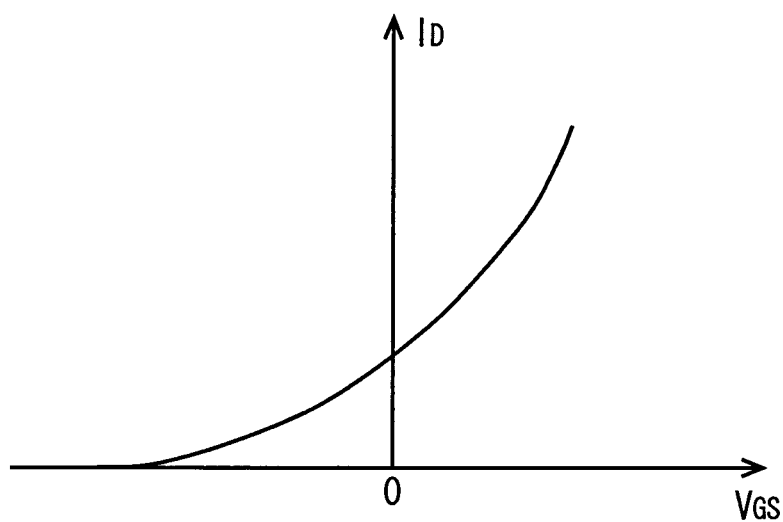
FIG. 4 shows exemplary characteristics of a drain current $I_D$ with respect to gate-source junction voltages $V_{GS}$ of each of a plurality of FETs provided in the switching apparatus 10 according to the present embodiment.

FIG. 4 shows exemplary characteristics of a drain current $I_D$ with respect to gate-source junction voltages $V_{GS}$ of each of a plurality of FETs provided in the switching apparatus 10 according to the present embodiment. All of the FETs of the switching apparatus 10 may have characteristics such as shown in FIG. 4.

For example, all of the FETs of the switching apparatus 10 may be N-channel depletion FETs with GaN compositions. As a result, all of the transistors of the switching apparatus 10 have normally-ON characteristics. The FETs of the switching apparatus 10 may have other characteristics.

Figure 5:
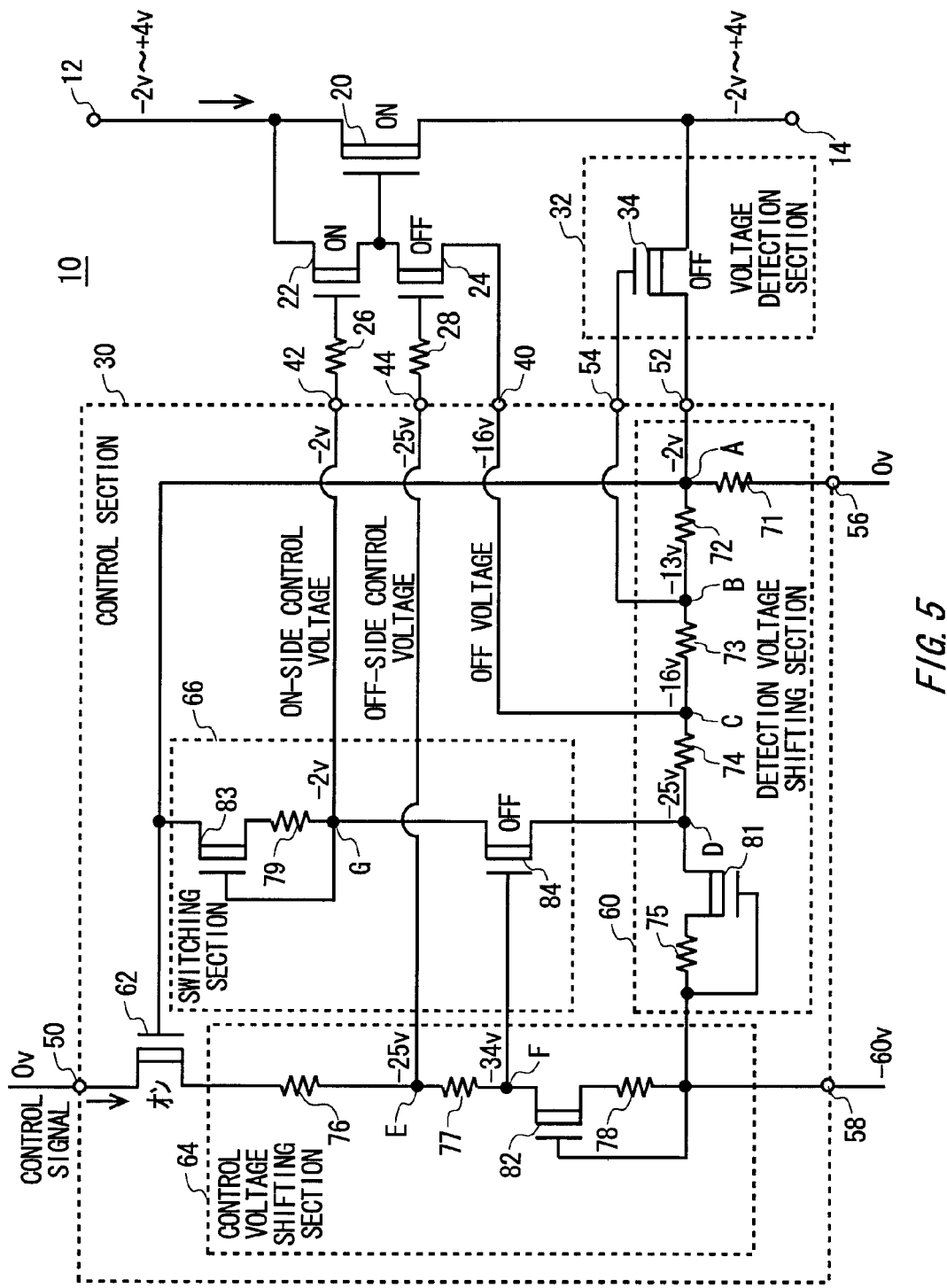
FIG. 5 shows exemplary states of each FET and voltages at each point when the switching apparatus 10 according to the present embodiment is in a connection state.

FIG. 5 shows exemplary states of each FET and voltages at each point when the switching apparatus 10 according to the present embodiment is in a connection state. The following describes operation of the switching apparatus 10 when the switching apparatus 10 is in the connection state during normal operation.

In the present embodiment, the switching apparatus 10 operates according to the following conditions. The voltages of the first terminal 12 and the second terminal 14 are no less than −2 V and no greater than +4 V during normal operation. Each FET of the switching apparatus 10 is an N-channel depletion FET that is completely ON when the gate-source junction voltage thereof is −6 V or higher and completely OFF when the gate-source junction voltage thereof is −9 V or lower.

A ground voltage of 0 V is applied to the ground terminal 56 of the switching apparatus 10. A negative power supply voltage of −60 V is applied to the power supply terminal 58 of the switching apparatus 10.

During normal operation, the detection voltage shifting section 60 generates −2 V, which is a gate voltage level that turns ON the ON FET 22, at the detection point A. During normal operation, the detection voltage shifting section 60 generates −13 V, which is a gate voltage level that turns OFF the detection FET 34, at the connection point B. During normal operation, the detection voltage shifting section 60 generates −16 V, which is a gate voltage level that turns OFF the main FET 20, at the connection point C. During normal operation, the detection voltage shifting section 60 generates −25 V, which is a gate voltage level that turns OFF the ON FET 22, at the connection point D.

During normal operation, −2 V, which is the voltage at the detection point A of the detection voltage shifting section 60, is applied to the gate of the control input FET 62. As a result, the control input FET 62 is turned ON and the resistance at the drain-source junction thereof is substantially 0.

When the first terminal 12 and the second terminal 14 are connected during normal operation, the switching apparatus 10 operating under the above conditions receives a control signal of 0 V from the outside. During normal operation, when the control signal of 0 V is applied, the control voltage shifting section 64 generates −25 V, which is a gate voltage level that turns OFF the OFF FET 24, at the connection point E. During normal operation, when the control signal of 0 V is applied, the control voltage shifting section 64 generates −34 V, which is a gate voltage level that turns OFF the first switching FET 84, at the connection point F. As a result, the first switching FET 84 is turned OFF when the control signal of 0 V is received during normal operation, and therefore the switching section 66 generates the detection point A voltage of −2 V, which is a gate voltage that turns ON the ON FET 22, at the connection point G.

From the above, when the control signal of 0 V is received during normal operation, the control section 30 applies the ON-side control voltage of −2 V generated from the connection point G to the gate of the ON FET 22. Since the source of the ON FET 22 is connected to the first terminal 12, a voltage no less than −2 V and no greater than +4 V is applied to the source of the ON FET 22. As a result, during normal operation, the gate-source junction voltage of the ON FET 22 is greater than or equal to −6 V, and so the ON FET 22 is completely ON.

When the control signal of 0 V is received during normal operation, the control section 30 applies the OFF-side control voltage of −25 V generated from the connection point E to the gate of the OFF FET 24, and applies the OFF voltage of −16 V generated from the connection point C to the source of the OFF FET 24. As a result, during normal operation, the gate-source junction voltage of the OFF FET 24 is −9 V, and so the OFF FET 24 is completely OFF.

In this way, when the control signal of 0 V is received during normal operation, the control section 30 can turn ON the ON FET 22 and turn OFF the OFF FET 24. As a result, the control section 30 can turn ON the main FET 20 so that the first terminal 12 and the second terminal 14 are in a connected state.

Figure 6:
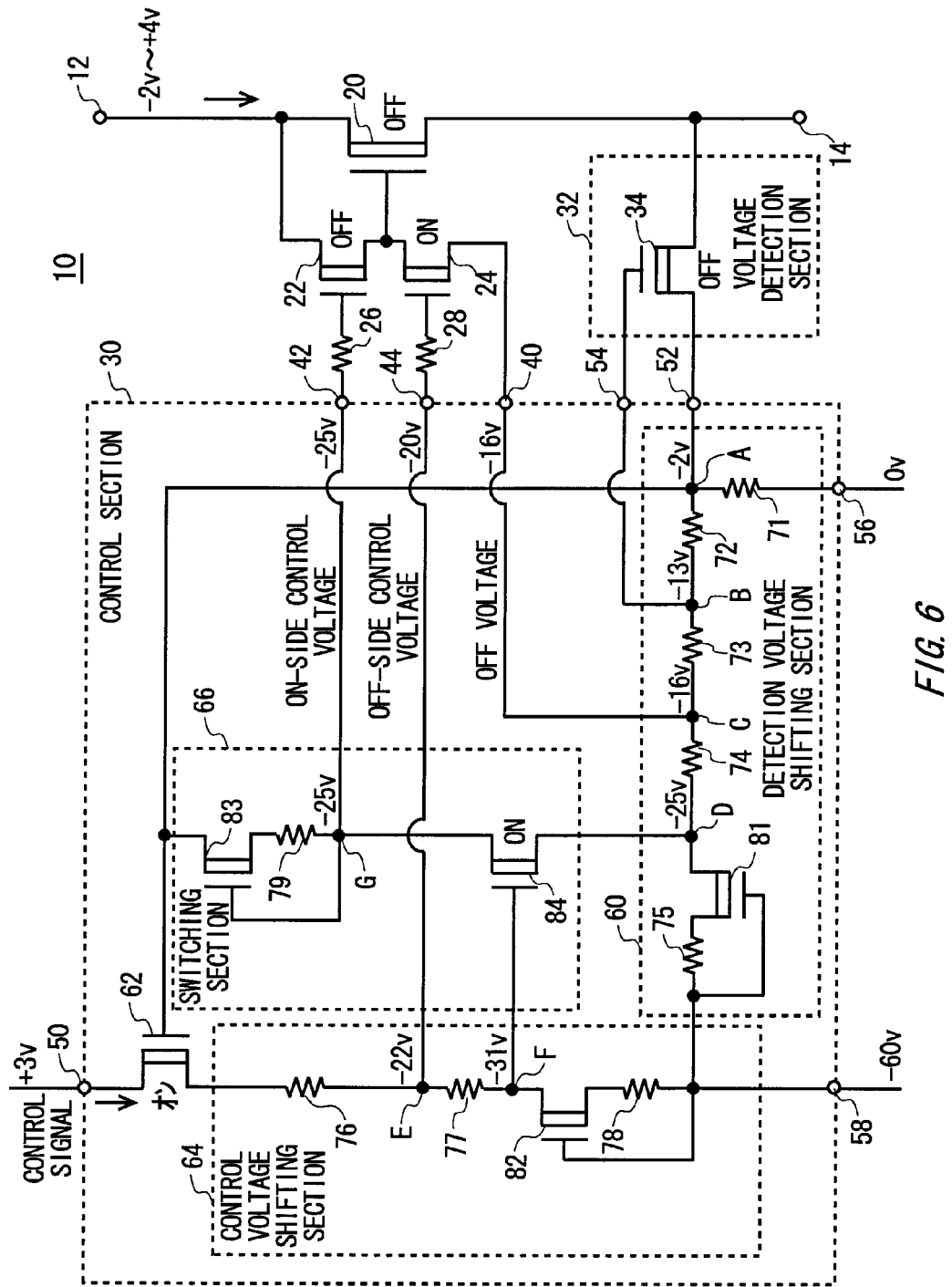
FIG. 6 shows exemplary states of each FET and voltages at each point when the switching apparatus 10 according to the present embodiment is in a disconnection state.

FIG. 6 shows exemplary states of each FET and voltages at each point when the switching apparatus 10 according to the present embodiment is in a disconnection state. The following describes operation of the switching apparatus 10 when the switching apparatus 10 is in the disconnection state during normal operation.

The switching apparatus 10 operates under the same conditions described in relation to FIG. 5. The voltages generated at the detection point A and the connection points B, C, and D in the detection voltage shifting section 60 are the same as in FIG. 5.

When disconnecting the first terminal 12 and the second terminal 14 during normal operation, the switching apparatus 10 receives a control signal of +3 V form the outside. When the control signal of +3 V is applied during normal operation, the control voltage shifting section 64 generates −22 V, which is a gate voltage level that turns ON the OFF FET 24, at the connection point E. When the control signal of +3 V is applied during normal operation, the control voltage shifting section 64 generates −31 V, which is a gate voltage level that turns ON the first switching FET 84, at the connection point F. As a result, the first switching FET 84 is turned ON, and therefore the switching section 66 generates the connection point D voltage of −25 V, which is a gate voltage that turns OFF the ON FET 22, at the connection point G.

From the above, when the control signal of +3 V is received during normal operation, the control section 30 can apply the ON-side control voltage of −25 V generated from the connection point G to the gate of the ON FET 22. Since the source of the ON FET 22 is connected to the first terminal 12, a voltage no less than −2 V and no greater than +4 V is applied to the source of the ON FET 22. As a result, the gate-source junction voltage of the ON FET 22 is less than or equal to −9 V, and so the ON FET 22 is completely OFF.

When the control signal of +3 V is received during normal operation, the control section 30 can apply the OFF-side control voltage of −22 V generated from the connection point E to the gate of the OFF FET 24 and apply the OFF voltage of −16 V generated from the connection point C to the source of the OFF FET 24. As a result, the gate-source junction voltage of the OFF FET 24 is −6 V, and so the OFF FET 24 is completely ON.

In this way, when the control signal of +3 V is received during normal operation, the control section 30 can turn OFF the ON FET 22 and turn ON the OFF FET 24. As a result, the control section 30 can apply the OFF voltage of −16 V generated from the connection point C to the gate of the main FET 20.

Here, a voltage no less than −2 V and no greater than +4 V is applied to the source of the main FET 20, and therefore the gate-source junction voltage of the main FET 20 is less than or equal to −9 V when a voltage of −16 V is applied to the gate thereof, and so the main FET 20 is completely OFF. As a result, the control section 30 can turn OFF the main FET 20 so that the first terminal 12 and the second terminal 14 are disconnected from each other.

In this way, the switching apparatus 10 of the present embodiment can provide a connection or a disconnection between the first terminal 12 and the second terminal 14. Furthermore, the switching apparatus 10 can improve the transmission characteristics by causing the gate of the main FET 20 to be floating when the main FET 20 is ON.

In the switching apparatus 10 shown in FIGS. 5 and 6, the voltage ranges of the first terminal 12 and the second terminal 14 may be from −2 V to +6 V. In this case, when the control signal of 0 V is received, the gate-source junction voltage of the ON FET 22 is in a range from −6 V to −8 V, and therefore it is possible for the ON FET 22 to be in a half-ON state that is neither completely ON nor completely OFF. However, even when the ON FET 22 is in this half-ON state, the gate-source junction voltage thereof is no less than −6 V, and so the main FET 20 is completely ON. Therefore, even when the voltage ranges of the first terminal 12 and the second terminal 14 are from −2 V to +6 V, the control section 30 can connect the first terminal 12 and the second terminal 14 to each other.

Figure 7:
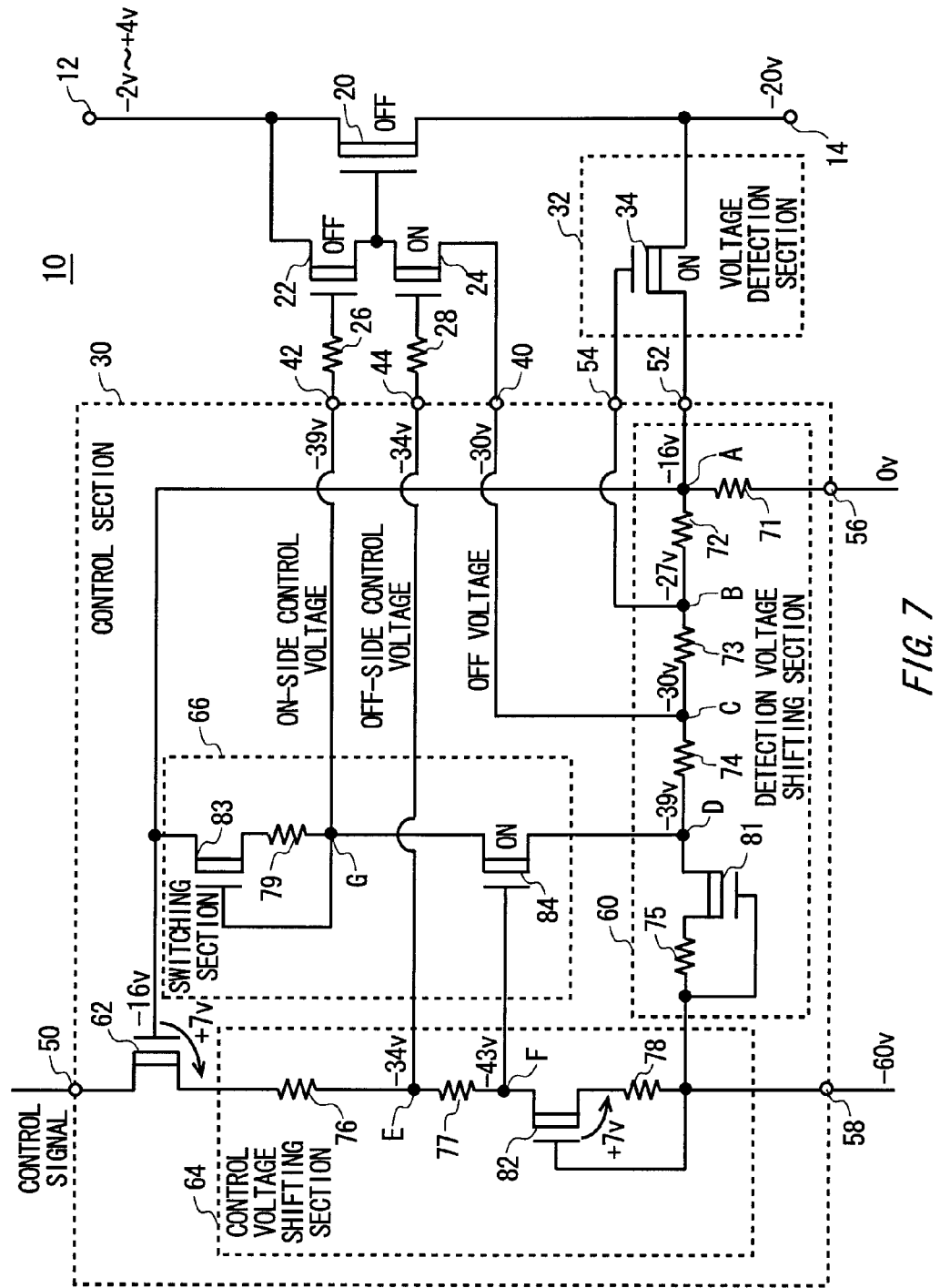
FIG. 7 shows exemplary states of each FET and voltages at each point when the voltage of the second terminal 14 is outside the reference range.

FIG. 7 shows exemplary states of each FET and voltages at each point when the voltage of the second terminal 14 is outside the reference range. The following describes operation of the switching apparatus 10 during irregular operation in which the voltage of the second terminal 14 is less than the predetermined reference voltage.

The switching apparatus 10 operates under the same conditions described in relation to FIG. 5. FIG. 7 shows the voltage at each point when the voltage of the second terminal 14 is −20 V.

When the voltage of the second terminal 14 drops to −20 V due to a malfunction in the device under test 300, for example, the gate-source junction voltage of the detection FET 34 is greater than or equal to −6 V, and so the detection FET 34 is ON. As a result, the second terminal 14 is connected to the detection terminal 52. When the second terminal 14 and the detection terminal 52 are connected, the detection voltage shifting section 60 generates −16 V at the detection point A.

Furthermore, the detection voltage shifting section 60 lowers the voltages at the connection points B, C, and D according to the voltage drop at the detection point A. More specifically, the detection voltage shifting section 60 generates −30 V, which is a gate voltage level that turns OFF the main FET 20, at the connection point C. The detection voltage shifting section 60 generates −39 V, which is a gate voltage level that turns OFF the ON FET 22, at the connection point D.

During irregular operation when the voltage of the second terminal 14 is −20 V, a voltage of −16 V, which is the voltage of the detection point A in the detection voltage shifting section 60, is applied to the gate of the control input FET 62, and so the control input FET 62 is in the half-ON state that is neither completely ON nor completely OFF. In this case, a current amount that is equal to the current amount flowing to the drain of the second constant current FET 82 flows to the drain of the control input FET 62. In the present embodiment, the second constant current FET 82 causes the potential difference from the gate voltage to the source voltage thereof to be +7 V. In the same manner as the second constant current FET 82, the control input FET 62 causes the potential difference from the gate voltage to the source voltage thereof to be +7 V.

As a result, during irregular operation when the voltage of the second terminal 14 is −20 V, the control voltage shifting section 64 generates −34 V, which is a gate voltage level that turns ON the OFF FET 24, at the connection point E. Furthermore, the control voltage shifting section 64 generates −43 V, which is a gate voltage level that turns ON the first switching FET 84, at the connection point F. As a result, the first switching FET 84 is ON during irregular operation when the voltage of the second terminal 14 is −20 V, and therefore the switching section 66 generates the connection point D voltage of −39 V, which is a gate voltage that turns OFF the ON FET 22, at the connection point G.

From the above, during irregular operation when the voltage of the second terminal 14 is −20 V, the control section 30 can apply the ON-side control voltage of −39 V generated from the connection point G to the gate of the ON FET 22. As a result, the gate-source junction voltage of the ON FET 22 is less than or equal to −9 V, and so the ON FET 22 is completely OFF.

Furthermore, during irregular operation when the voltage of the second terminal 14 is −20 V, the control section 30 can apply the OFF-side control voltage of −34 V generated from the connection point E to the gate of the OFF FET 24 and the OFF voltage of −30 V generated from the connection point C can be applied to the source of the OFF FET 24. As a result, the gate-source junction voltage of the OFF FET 24 is −4 V, and so the OFF FET 24 is completely ON.

In this way, during irregular operation when the voltage of the second terminal 14 is −20 V, the control section 30 can turn OFF the ON FET 22 and turn ON the OFF FET 24. As a result, the control section 30 can turn OFF the main FET 20 to disconnect the first terminal 12 and the second terminal 14 from each other.

In this way, the switching apparatus 10 can forcibly disconnect the main FET 20 when the voltage of the second terminal 14 drops, and can therefore protect circuits connected on the first terminal 12 side. In the present embodiment, in the detection FET 34, the source-drain junction resistance drops when the gate-source voltage is approximately −8 V, and becomes completely ON when the gate-source voltage is −6 V or more. Accordingly, the switching apparatus 10 can decrease the voltage of the detection point A when the voltage of the second terminal 14 is less than or equal to −5 V, thereby turning OFF the main FET 20.

The following describes an example in which the voltage of the second terminal 14 becomes higher than the voltage of the first terminal 12 due to a malfunction or the like of the device under test 300, for example, when the main FET 20 is ON. In this case, the voltage of the second terminal 14 is applied to the source of the ON FET 22 through the drain and source of the main FET 20 in the ON state.

Here, when the main FET 20 is ON, a voltage of −2 V is applied to the gate of the ON FET 22. Accordingly, when the second terminal 14 becomes +7 V, the gate-source junction voltage of the ON FET 22 is −9 V, and so the ON FET 22 is completely OFF. As a result, the ON FET 22 and the OFF FET 24 are both completely OFF.

When the ON FET 22 and the OFF FET 24 are both completely OFF at the same time, the charge accumulated by the gate capacitance of the main FET 20 is held. Accordingly, the gate of the main FET 20 is fixed at a potential of +7 V.

Next, when the voltage of the second terminal 14 increases further, the potential of the first terminal 12, i.e. the source potential of the main FET 20, also increases via the drain and source of the main FET 20 in the ON state. For example, when the voltage of the second terminal 14 increases to +8 V, +9 V, +10 V, etc., the potential of the first terminal 12, i.e. the source potential of the main FET 20, also increases to +8 V, +9 V, +10 V, etc.

When the voltage of the second terminal 14 becomes +16 V or more, the gate-source junction voltage of the main FET 20 is −9 V, and so the main FET 20 is completely OFF. Accordingly, when the voltage of the second terminal 14 is greater than or equal to +16 V, the first terminal 12 and the second terminal 14 are disconnected from each other and the voltage of second terminal 14 is not transferred to the first terminal 12 side.

Next, when the voltage of the second terminal 14 rises further, current flows from the second terminal 14 to the first terminal 12 through the drain and source of the main FET 20 in the ON state. This current is determined according to the sum of the output impedance of an external circuit connected to the first terminal 12 and the drain-source junction resistance of the main FET 20.

The current flowing from the second terminal 14 to the first terminal 12 increases at first according to the increase of the voltage of the second terminal 14. However, the amount by which the current increases gradually decreases as the voltage of the second terminal 14 increases. Accordingly, the increase amount becomes 0 when the voltage of the second terminal 14 reaches a certain operation point, and after this the current flowing from the second terminal 14 to the first terminal 12 remains constant without increasing in accordance with the voltage increase of the second terminal 14. The operation point at which the current from the second terminal 14 to the first terminal 12 stops increasing is determined by the output impedance of the external circuit connected to the first terminal 12.

The drain-source junction voltage of the main FET 20 increases proportionally with the drain potential when a constant current flows through the drain and source. Accordingly, the source potential of the main FET 20, i.e. the potential of the first terminal 12, is limited by the constant voltage.

In this way, when the voltage of the second terminal 14 becomes higher than the voltage of the first terminal 12, the main FET 20 can impose a voltage limitation on the characteristics of the FETs. In other words, when the ON FET 22 receives the voltage of the second terminal 14 via the main FET 20 and the voltage of the second terminal 14 exceeds the reference range, the gate potential of the main FET 20 is fixed. As a result, a portion of the excess current of the second terminal 14 greater than a predetermined voltage is not transferred to the first terminal 12. Accordingly, when the voltage of the second terminal 14 is outside of a range from a predetermined lower limit voltage to an upper limit voltage, the switching apparatus 10 can perform a forcible disconnect or limiting.

Figure 8:
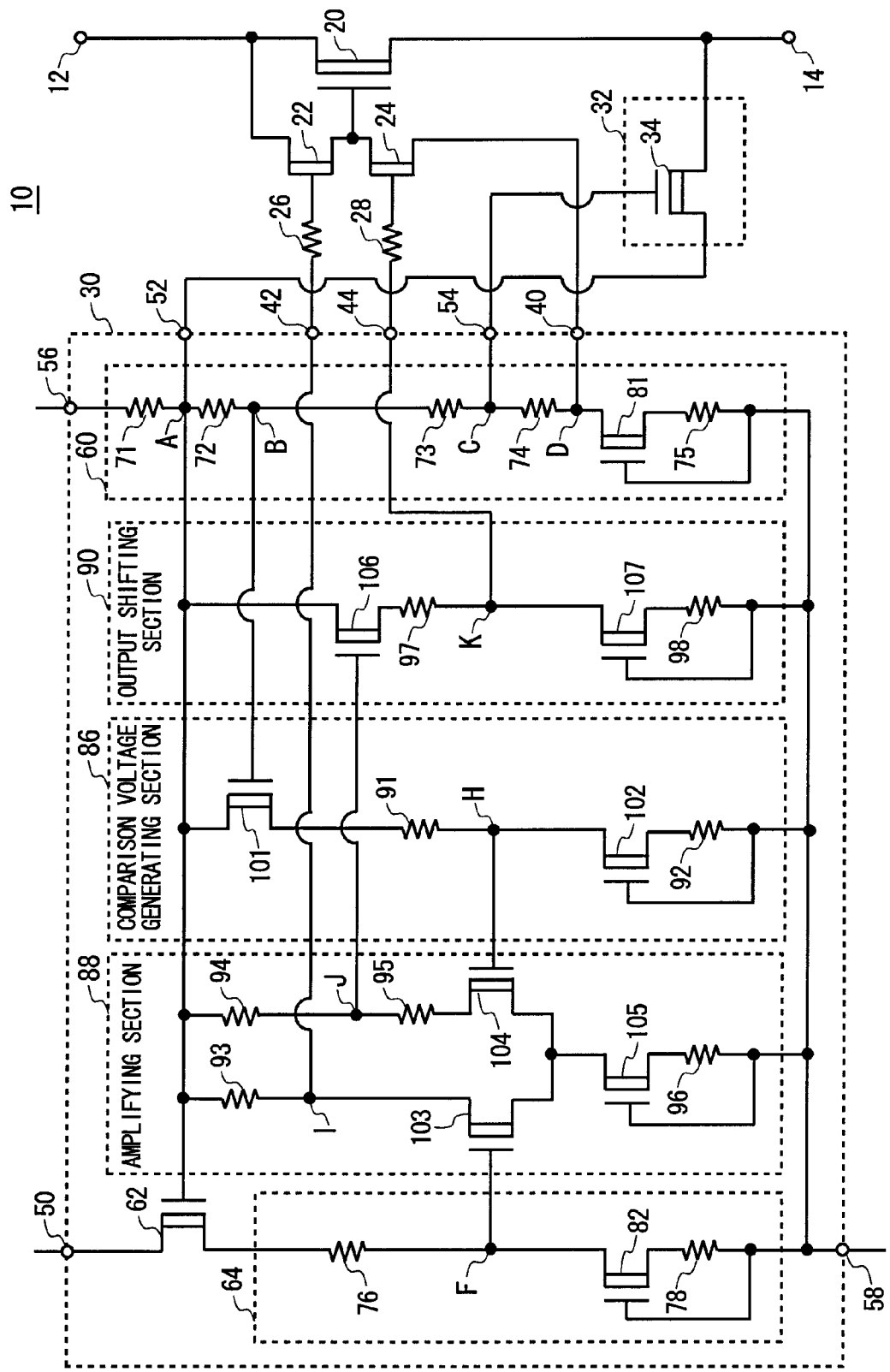
FIG. 8 shows a circuit configuration of the switching apparatus 10 according to a modification of the present embodiment.

FIG. 8 shows a circuit configuration of the switching apparatus 10 according to a modification of the present embodiment. The switching apparatus 10 of the present modification adopts substantially the same function and configuration as the switching apparatus 10 shown in FIG. 3. Therefore, circuits that are substantially the same as those in the switching apparatus 10 of FIG. 3 are given the same reference numerals and only differing points are described.

The control section 30 of the present modification includes a detection voltage shifting section 60, a control input FET 62, a control voltage shifting section 64, a comparison voltage generating section 86, an amplifying section 88, and an output shifting section 90. In the present modification, the connection point B in the detection voltage shifting section 60 is connected to the gate of a first shifting FET 101 in the comparison voltage generating section 86. In the present modification, the connection point C in the detection voltage shifting section 60 is connected to the gate voltage terminal 54.

In the present modification, the control voltage shifting section 64 includes a sixth resistor 76, an eighth resistor 78, and a second constant current FET 82. One end of the sixth resistor 76 is connected to the source of the control input FET 62, and the other end of the sixth resistor 76 is connected to the drain of the second constant current FET 82.

When the control input FET 62 is completely ON, the control voltage shifting section 64 according to the present modification generates a voltage shifted from the voltage of the control signal by an amount equal to the voltage generated by the sixth resistor 76, at the connection point F between the sixth resistor 76 and the drain of the second constant current FET 82. The connection point F is connected to the gate of a first differential FET 103 in the amplifying section 88. Accordingly, in this case, the control voltage shifting section 64 can generate a control shift voltage obtained by shifting the voltage of the control signal by a prescribed amount, and supply this control shift voltage to the amplifying section 88.

When the control input FET 62 is not completely ON, the control voltage shifting section 64 generates a voltage shifted from the voltage of the detection point A by an amount equal to the sum of the gate-source junction voltage of the control input FET 62 and the voltage generated by the sixth resistor 76, at the connection point F. Accordingly, in this case, the control voltage shifting section 64 can supply the amplifying section 88 with a control shift voltage that is shifted from the voltage at the detection point A by a predetermined amount.

When the control input FET 62 is completely on, the control voltage shifting section 64 described above can output a control shift voltage corresponding to the voltage of the control signal. Accordingly, the control voltage shifting section 64 can switch the level of the control shift voltage according to switching of the voltage of the control signal. Furthermore, when the control input FET 62 is not completely ON, the control voltage shifting section 64 can output a control shift voltage with a predetermined level.

The comparison voltage generating section 86 is provided between the detection point A of the detection voltage shifting section 60 and the power supply terminal 58. The comparison voltage generating section 86 generates a comparison voltage by shifting the voltage of the connection point B generated by the detection voltage shifting section 60 by a predetermined voltage amount.

The comparison voltage generating section 86 includes a first shifting FET 101, a tenth resistor 91, an eleventh resistor 92, and a fourth constant current FET 102. The drain of the first shifting FET 101 is connected to the detection point A and the gate is connected to the connection point B. One end of the tenth resistor 91 is connected to the source of the first shifting FET 101 and the other end of the tenth resistor 91 is connected to the drain of the fourth constant current FET 102.

One end of the eleventh resistor 92 is connected to the source of the fourth constant current FET 102 and the other end of the eleventh resistor 92 is connected to the power supply terminal 58. The gate of the fourth constant current FET 102 is connected to the power supply terminal 58.

In the comparison voltage generating section 86 described above, the eleventh resistor 92 and the fourth constant current FET 102 cause a constant current to flow to the tenth resistor 91, and the first shifting FET 101 causes a current that is the same as that of the fourth constant current FET 102. Accordingly, the comparison voltage generating section 86 can generate the comparison voltage by shifting the voltage of the connection point B of the detection voltage shifting section 60 by a predetermined voltage amount, at the connection point H between the tenth resistor 91 and the drain of the fourth constant current FET 102.

The amplifying section 88 performs differential amplification on the difference between the control shift voltage generated from the connection point F of the control voltage shifting section 64 and the comparison voltage generated from the connection point H of the comparison voltage generating section 86. The amplifying section 88 supplies the gate of the ON FET 22 with the positive amplified voltage as the ON-side control voltage. The amplifying section 88 outputs the negative amplified voltage to the output shifting section 90.

The amplifying section 88 may include a twelfth resistor 93, a thirteenth resistor 94, a fourteenth resistor 95, a first differential FET 103, a second differential FET 104, a fifteenth resistor 96, and a fifth constant current FET 105. One end of the twelfth resistor 93 is connected to the detection point A and the other end of the twelfth resistor 93 is connected to the drain of the first differential FET 103. One end of the thirteenth resistor 94 is connected to the detection point A. One end of the fourteenth resistor 95 is connected to end of the thirteenth resistor 94 that is not connected to the detection point A, and the other end of the fourteenth resistor 95 is connected to the drain of the second differential FET 104.

The gate of the first differential FET 103 is connected to the connection point F in the control voltage shifting section 64, and the source of the first differential FET 103 is connected to the drain of the fifth constant current FET 105. The gate of the second differential FET 104 is connected to the connection point H of the comparison voltage generating section 86, and the source of the second differential FET 104 is connected to the drain of the fifth constant current FET 105.

One end of the fifteenth resistor 96 is connected to the source of the fifth constant current FET 105, and the other end of the fifteenth resistor 96 is connected to the power supply terminal 58. The gate of the fifth constant current FET 105 connected to the power supply terminal 58.

The amplifying section 88 described above switches between the first differential FET 103 and the second differential FET 104 according to the difference between the control shift voltage generated from the connection point F of the control voltage shifting section 64 and the comparison voltage generated from the connection point H of the comparison voltage generating section 86. A connection point I between the twelfth resistor 93 and the drain of the first differential FET 103 in the amplifying section 88 is connected to the ON-side terminal 42. The amplifying section 88 can output the ON-side control voltage with a level that switches according to the voltage of the control signal.

A connection point J between the thirteenth resistor 94 and the fourteenth resistor 95 in the amplifying section 88 is connected to the gate of the second shifting FET 106 in the output shifting section 90. The amplifying section 88 can output, from the connection point J, a voltage that switches in a manner that is the inverse of the ON-side control voltage.

The output shifting section 90 generates the OFF-side control voltage by shifting the voltage of the connection point J in the amplifying section 88 by a predetermined voltage amount. The output shifting section 90 supplies the gate of the OFF FET 24 with the generated OFF-side control voltage.

The output shifting section 90 includes a second shifting FET 106, a sixteenth resistor 97, a seventeenth resistor 98, and a sixth constant current FET 107. The drain of the second shifting FET 106 is connected to the detection point A and the gate of the second shifting FET 106 is connected to the connection point J. One end of the sixteenth resistor 97 is connected to the source of the second shifting FET 106 and the other end of the sixteenth resistor 97 is connected to the drain of the sixth constant current FET 107.

One end of the seventeenth resistor 98 is connected to the source of the sixth constant current FET 107, and the other end of the seventeenth resistor 98 is connected to the power supply terminal 58. The gate of the sixth constant current FET 107 is connected to the power supply terminal 58.

In the output shifting section 90 described above, the seventeenth resistor 98 and the sixth constant current FET 107 cause a constant current to flow to the sixteenth resistor 97, and the second shifting FET 106 causes a current that is the same as that of the fourth constant current FET 102. Accordingly, the output shifting section 90 can generate the comparison voltage by shifting the voltage at the connection point J of the amplifying section 88 by a predetermined voltage amount, at a connection point K between the sixteenth resistor 97 and the drain of the sixth constant current FET 107.

The connection point K in the output shifting section 90 is connected to the gate of the OFF FET 24. As a result, the output shifting section 90 can supply the gate of the OFF FET 24 with an OFF-side control voltage that is obtained by further shifting the voltage that switches in the inverse manner of the ON-side control voltage.

The control section 30 of the present modification can switch between a state in which the ON FET 22 is ON and the OFF FET 24 is OFF and a state in which the ON FET 22 is OFF and the OFF FET 24 is ON, according to the voltage of the control signal input to the control terminal 50. As a result, the control section 30 of the present modification can turn the main FET 20 ON and OFF.

Furthermore, when the detection FET 34 is ON, the control section 30 of the present modification decreases the voltage of the detection point A and also decreases the comparison voltage supplied to the amplifying section 88. As a result, the control section 30 of the present modification can turn OFF the ON FET 22 and turn ON the OFF FET 24, thereby disconnecting the first terminal 12 and the second terminal 14 from each other.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A switching apparatus comprising:
   a main switch provided between a first terminal and a second terminal;
   a voltage detection section that detects whether voltage of the second terminal is within a reference range; and
   a control section that controls the main switch according to a control signal received from a control terminal and turns OFF the main switch when the voltage of the second terminal is outside the reference range, wherein
   the voltage detection section includes a detection switch that disconnects the second terminal and the control section from each other when the voltage of the second terminal is within the reference range and connects the second terminal and the control section to each other when the voltage of the second terminal is outside the reference range.

2. The switching apparatus according to claim 1, further comprising:
   an ON switch that is electrically connected between the first terminal and a gate of the main switch; and
   an OFF switch that is electrically connected between the gate of the main switch and an OFF voltage for turning OFF the main switch, wherein
   the control section turns ON the ON switch and turns OFF the OFF switch when turning on the main switch, and turns OFF the ON switch and turns ON the OFF switch when turning OFF the main switch.

3. The switching apparatus according to claim 2, wherein the control section includes:
   a control voltage shifting section that generates an OFF-side control voltage, which is obtained by shifting voltage of the control signal and is supplied to a gate of the OFF switch; and
   a control input switch with a drain-gate junction that is connected between the control terminal and the control voltage shifting section, and a gate that is electrically connected to a detection point on a side of the detection switch opposite the second terminal, and
   in response to the voltage of the second terminal being outside the reference range and the detection switch being in a connected state, the control input switch supplies the voltage shifting section with voltage corresponding to voltage of the detection point and causes the voltage shifting section to generate an OFF-side control voltage that turns ON the OFF switch.

4. The switching apparatus according to claim 3, wherein the control section further includes a detection voltage shifting section that supplies the OFF switch with an OFF voltage obtained by shifting the voltage of the detection point.

5. The switching apparatus according to claim 4, wherein
the detection voltage shifting section further generates an ON-side control voltage for turning OFF the ON switch, by shifting the voltage of the detection point,
the control voltage shifting section further generates an internal control voltage for controlling whether the ON-side control voltage generated by the detection voltage shifting section is supplied to the ON switch, by shifting voltage received from the control input switch, and
the switching apparatus further comprises a switching section that switches whether the ON-side control voltage generated by the detection voltage shifting section is supplied to the ON switch, according to the internal control voltage.

6. The switching apparatus according to claim 2, wherein the main switch transmits a signal received from the first terminal to the second terminal.

7. The switching apparatus according to claim 2, wherein the detection switch is ON when the voltage of the second terminal is less than a reference voltage.

8. The switching apparatus according to claim 2, wherein the ON switch receives the voltage of the second terminal via the main switch, and is turned OFF to turn OFF the main switch when the voltage of the second terminal exceeds the reference range.

9. The switching apparatus according to claim 2, wherein the control section includes:
a control voltage shifting section that generates a control shift voltage by shifting voltage of the control signal; and
an amplifying section that amplifies the control shift voltage, and outputs an ON-side control voltage that is supplied to a gate of the ON switch and an OFF-side control voltage that is supplied to a gate of the OFF switch.

10. The switching apparatus according to claim 9, wherein
the amplifying section further includes a first switch and a second switch that are connected in parallel between a constant current source and a detection point on a side of the detection switch opposite the second terminal, the first switch receiving the control shift voltage at a gate thereof and the second switch receiving a comparison voltage at a gate thereof,
the ON-side control voltage is supplied from the detection point side of the first switch to the gate of the ON switch, and
the gate of the OFF switch is supplied with the OFF-side control voltage obtained by shifting voltage on the detection point side of the second switch.

11. A test apparatus that tests a device under test, comprising:
a test signal generating section that generates a test signal for testing the device under test; and
the switching apparatus according to claim 1 that is provided between the test signal generating section and the device under test, and provides a connection or a disconnection between the test signal generating section and the device under test.

12. A switching apparatus comprising:
a main switch provided between a first terminal and a second terminal;
an ON switch electrically connected between the first terminal and a gate of the main switch;
an OFF switch electrically connected between the gate of the main switch and an OFF voltage that turns OFF the main switch; and
a control section that turns ON the ON switch and turns OFF the OFF switch when turning ON the main switch, and turns OFF the ON switch and turns ON the OFF switch when turning OFF the main switch.

* * * * *